United States Patent [19]

Wu

[11] Patent Number: 5,017,812

[45] Date of Patent: May 21, 1991

[54] COMBINED ECL-TO-TTL TRANSLATOR AND DECODER

[75] Inventor: Chau-Chin Wu, Cupertino, Calif.

[73] Assignee: Integrated Device Technology, Inc., Santa Clara, Calif.

[21] Appl. No.: 496,470

[22] Filed: Mar. 20, 1990

[51] Int. Cl.⁵ .......................................... H03K 19/92
[52] U.S. Cl. .................................... 307/475; 307/446; 307/449; 307/451; 307/455
[58] Field of Search ............... 307/443, 446, 449, 451, 307/455, 475, 570

[56] References Cited

U.S. PATENT DOCUMENTS

| | | | |
|---|---|---|---|
| 4,636,665 | 1/1987 | McLaughlin | 307/446 X |
| 4,695,750 | 9/1987 | Hava et al. | 307/446 X |
| 4,697,109 | 9/1987 | Hanma et al. | 307/446 X |
| 4,724,343 | 9/1988 | LeRoux et al. | 307/475 |
| 4,779,016 | 10/1988 | Sugiyama et al. | 307/475 |
| 4,798,977 | 1/1989 | Sakui et al. | 307/449 X |
| 4,857,772 | 8/1989 | Herndon | 307/449 X |
| 4,883,988 | 11/1989 | Ide et al. | 307/475 X |
| 4,883,990 | 11/1989 | Umeki | 307/475 X |
| 4,958,094 | 9/1990 | Ishii et al. | 307/443 X |
| 4,968,905 | 11/1990 | Sanwo et al. | 307/443 X |

Primary Examiner—David Hudspeth
Attorney, Agent, or Firm—Skjerven, Morrill, MacPherson, Franklin & Friel

[57] ABSTRACT

A combined ECL-to-TTL translator and decoder circuit consumes less power and has improved speed over prior art translator-decoder circuits. Low power consumption occurs since current does not flow appreciably through the combined translator-decoder circuit when its corresponding decoded output line is not selected. The combined circuit is faster than prior art translator-decoders due to reduced circuitry. The circuit includes a pair of transistors connected in series, a pair of transistors connected in parallel, and a pair of transistors connected as a current mirror.

4 Claims, 3 Drawing Sheets

COMBINED ECL-TO-TTL TRANSLATOR AND DECODER

BACKGROUND OF THE INVENTION

1. Scope of the Invention

The invention relates to logic translators and decoders, and specifically to a combined ECL-to-TTL translator and decoder circuit.

2. Description of the Prior Art

TTL (transistor-transistor logic) and ECL (emitter coupled logic) are two popular logic families in use today. Many manufacturers of integrated circuits offer an enormous variety of circuit functions in both families.

FIG. 1 shows the ranges of voltages that correspond to the logic states (HIGH and LOW) for the TTL and ECL digital logic families. The cross-hatched area above each voltage line shows the specified range of output voltages that a logic LOW or HIGH is guaranteed to fall within, with the pair of arrows indicating typical output values (LOW, HIGH) encountered in practice. The cross-hatched area below each voltage line shows the range of input voltages that are guaranteed to be interpreted as LOW or HIGH at an input line, with the arrow indicating the typical logic threshold voltage, i.e., the dividing line between LOW and HIGH. In both cases, a logic HIGH is more positive than a logic LOW.

TTL is a popular saturating logic family characterized by high speed and low power dissipation. TTL integrated circuits are extremely versatile, and they are small, economical, and reliable. Such ICs include a wide variety of gate circuits and flip flops in small-scale-integration (SSI). In addition, medium-scale-integration (MSI) ICs consist of decoders, memories, adders, counters, shift registers, multiplexers, and many others. These gates and functional networks provide for simplified design implementation.

A special form of TTL that achieves a very high speed of operation is Schottky TTL. Low propagation delay is obtained by preventing the transistors from operating in the saturation mode.

ECL, also known as current-mode logic, is a popular non-saturating logic family characterized with a small voltage swing as shown in FIG. 1. ECL is currently the fastest form of logic since the active devices within it are arranged to operate out of saturation. In addition to avoiding stored charge by this means, ECL is made even faster since the logic swings are relatively small (about 0.8 V). Thus, the time required for charging and discharging the various load and parasitic capacitances is quite short.

Both ECL and TTL logic circuits are in wide-spread use today. The ECL and TTL circuits are incompatible with one another, however, due to the differences in logic voltage levels, and hence cannot be connected directly to one another. When an ECL circuit must communicate with a TTL circuit, therefore, a circuit known as an ECL-to-TTL translator must interface the circuits.

Manufacturers commonly design logic gates and medium-scale-integrated circuits with a built-in ECL-to-TTL translator such that the circuit accepts ECL logic signals at its inputs and provides TTL logic signals at its outputs. FIG. 2 illustrates a circuit configured as a 2-by-4 decoder which accepts ECL logic input signals and provides decoded TTL logic output signals ECL input line A is connected to an ECL input buffer 10, and ECL input line B is connected to an ECL input buffer 11. ECL input buffer 10 provides output signals at the lines labelled buffered lines A and $\overline{A}$ and ECL input buffer 11 provides output signals at the lines labelled buffered lines B and $\overline{B}$ During operation, when an ECL input signal at ECL input line A is logic HIGH at a voltage $-V_{be}$ (where $-V_{be} \approx -0.9$ volts), an output signal on buffered line A is at a voltage of approximately $-V_{be}$ and an output signal on buffered line $\overline{A}$ is at a voltage of approximately $-3V_{be}$ volts. When ECL input line A is logic LOW at $-2V_{be}$, the output signal on buffered line A is at a voltage of approximately $-3V_{be}$ and the output signal on buffered line $\overline{A}$ is at a voltage of approximately $-V_{be}$.

ECL input buffer 11 operates similarly. When an ECL signal at ECL input line B is logic HIGH at $-V_{be}$ volts, a signal on buffered line B is at approximately $-V_{be}$ volts and a signal on buffered line $\overline{B}$ is at approximately $-3V_{be}$ volts. When the signal at input line B is logic LOW at $-2V_{be}$ volts, the signal on buffered line B is at approximately $-3V_{be}$ volts and the signal on buffered line $\overline{B}$ is at approximately $-V_{be}$ volts.

Buffered lines A and $\overline{A}$ of ECL input buffer 10 are connected to a translator circuit 13 and to a translator circuit 14. Similarly, buffered lines B and $\overline{B}$ of ECL input buffer 11 are connected to a translator circuit 15 and to a translator circuit 16. Translator circuits 13-16 provide TTL output signals at TTL lines A, $\overline{A}$ B, and $\overline{B}$ which are TTL logic equivalents of the ECL input signals at ECL input lines A and B. For example, when ECL input line A is logic HIGH and ECL input line B is logic LOW, then TTL line A is logic HIGH, TTL line $\overline{A}$ is logic LOW, TTL line B is logic LOW, and TTL line $\overline{B}$ is logic HIGH.

TTL lines A, $\overline{A}$ B, and $\overline{B}$ of TTL translator circuits 13-16 are connected to NOR gates 17, 18, 19, and 20. Thus, the overall circuit of FIG. 2 implements a two-by-four decoder which accepts ECL input signals and provides decoded TTL output signals.

Translator circuit 13 includes P-channel FETs 13a and 13b and N-channel FETs 13c and 13d. N-channel FETs 13c and 13d are configured as a current mirror, and thus current $I_b$ can flow only when current $I_a$ flows. FETs 13a and 13b are controlled by the signals at buffered lines A and $\overline{A}$ Translator circuits 14-16 are arranged similarly. However, the connections from the buffered lines to the gates of each P-channel FET varies for each translator circuit.

When ECL input line A is logic HIGH, P-channel FETs 13a and 14b are biased OFF while P-channel FETs 13b and 14a are biased ON. TTL output line $\overline{A}$ is thus LOW and TTL output line A is HIGH. Similarly, when ECL input line B is logic HIGH, P-channel FETs 15a and 16b are biased OFF and P-channel FETs 15b and 16a are biased ON. When FET 14a is biased ON, current $I_a$ flows through FET 14a and FET 14c. Similarly, when FET 16a is biased ON, current $I_a$ flows through FET 16a and FET 16c. Appreciable power is consequently dissipated in translator circuits 14 and 16. Appreciable power is not dissipated in translator circuits 13 and 15 when FETs 13a and 15a are OFF since current $I_a$ is approximately zero and therefore current $I_b$ is approximately zero.

When ECL input line A goes LOW, thus turning on FET 13a and turning off FET 14a, the voltage at TTL output line $\overline{A}$ goes HIGH and the voltage at TTL output line A goes LOW. In addition, when ECL input line B goes LOW, FET 15a turns ON and FET 16a turns OFF. Hence, when ECL input lines A and B are both LOW, appreciable power is dissipated in translator circuits 13 and 15.

For the circuit of FIG. 2, it is apparent that for any given ECL input signal combination, exactly two of the P-channel FETs 13a, 14a, 15a, and 16a are biased ON which thus allows current $I_a$ to flow. Consequently, appreciable power is dissipated in exactly two of the translator circuits 13-16 for any given ECL input combination.

SUMMARY OF THE INVENTION

A combined ECL-to-TTL translator and decoder circuit according to the invention consumes less power and is faster than prior art translator-decoder circuits. Low power consumption occurs since current does not flow appreciably through the combined translator-decoder circuit when its corresponding decoded output line is not selected. The combined circuit is faster than prior art translator-decoders since NOR gates are not required.

The combined translator and decoder circuit comprises a first transistor having a control line connected to receive a signal indicative of a first ECL input signal and a second transistor connected in series with the first transistor and having a control line connected to receive a signal indicative of a second ECL input signal. The combined translator and decoder circuit further comprises a third transistor having a control line connected to receive a signal indicative of the first ECL input signal and a fourth transistor connected in parallel with the third transistor and having a control line connected to receive a signal indicative of the second ECL input signal. Finally, a current mirror circuit is provided which is connected to the second transistor, to the fourth transistor, and to an output line.

The invention will be more readily understood by reference to the drawings and the detailed description. As will be appreciated by one skilled in the art, the invention is applicable to combined translator-decoder circuits in general, and is not limited to the specific embodiments disclosed.

DETAILED DESCRIPTION

Figure 3:
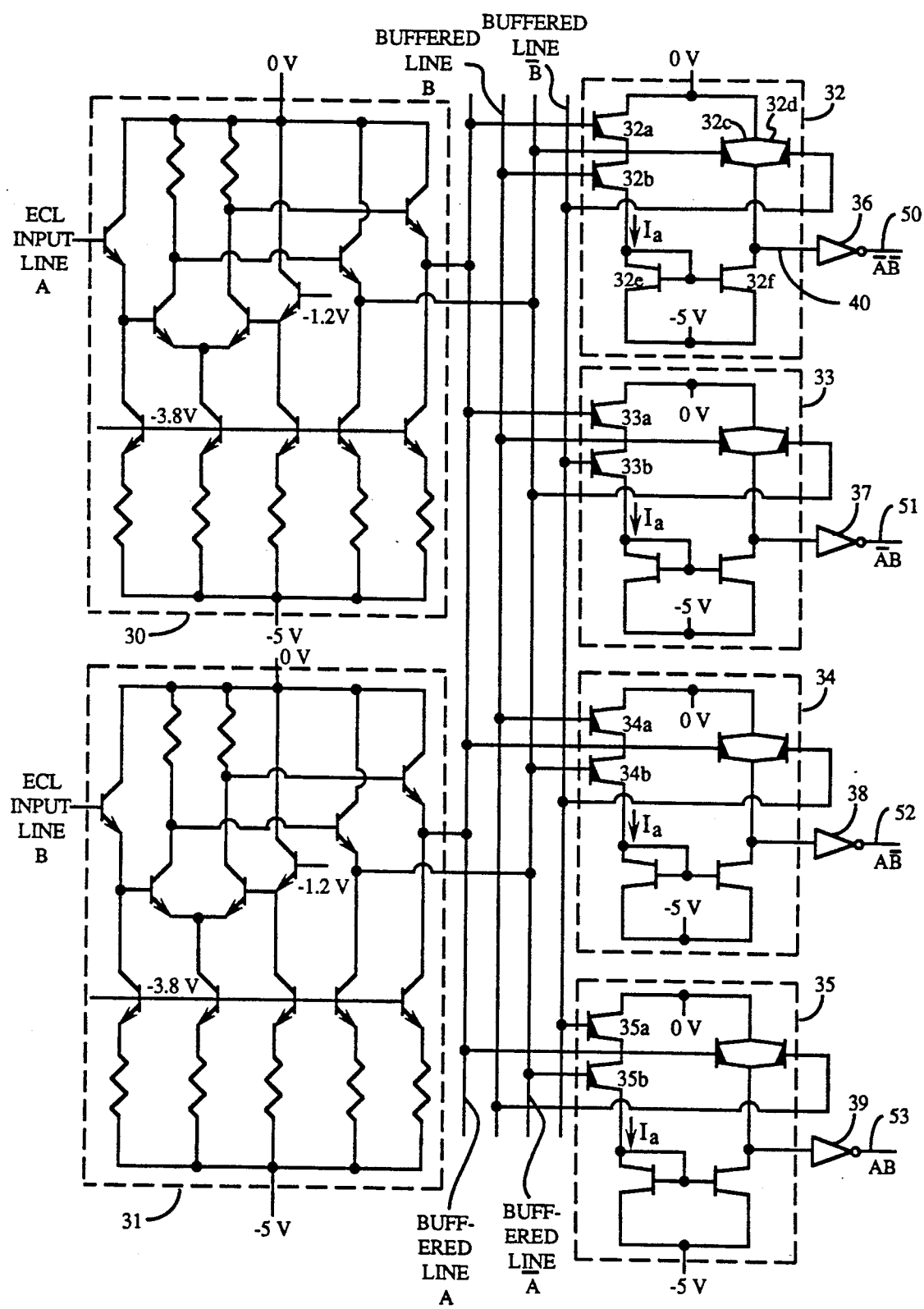
FIG. 3 shows a combined ECL-to-TTL translator and decoder circuit in accordance with the invention.

Referring to FIG. 3, a circuit is shown which accepts ECL input signals at ECL input lines A and B and provides decoded TTL output signals at output lines $\overline{AB}$ $\overline{A}$, $A\overline{B}$ and AB. The circuit includes ECL input buffers 30 and 31, combined translator-decoder circuits 32-35, and BiCMOS drivers 36-39.

ECL input buffers 30 and 31 provide signals on buffered lines A, $\overline{A}$ B, and $\overline{B}$ which are indicative of ECL input signals at ECL input lines A and B When a HIGH ECL signal having a voltage $-V_{be}$ is applied to ECL input line A, a signal on buffered line A goes to $-V_{be}$ volts and a signal on buffered line $\overline{A}$ goes to $-3V_{be}$ volts. When a LOW ECL signal having a voltage $-2V_{be}$ is applied to ECL input line A, the signal on buffered line A goes to $-3V_{be}$ volts and the signal on buffered line $\overline{A}$ goes to $-V_{be}$ volts. ECL input buffer 31 operates similarly.

Each buffered line A, $\overline{A}$ B, and $\overline{B}$ is connected to each of the combined translator-decoder circuits 32-35. Translator-decoder circuit 32 comprises a P-channel FET 32a connected in series with a P-channel FET 32b, a P-channel FET 32c connected in parallel with a P-channel FET 32d, and a current mirror consisting of N-channel FETs 32e and 32f. The gate of each P-channel FET 32a-32d is connected to one of the buffered lines A, B, $\overline{A}$ or $\overline{B}$ The gate of FET 32a is connected to buffered line A, the gate of FET 32b is connected to buffered line B, the gate of FET 32c is connected to buffered line $\overline{A}$ and the gate of FET 32d is connected to buffered line $\overline{B}$ During operation, the TTL output signal at line 40 is given by the logic equation:

$$Line\ 40 = A + B$$

Line 40 is connected to the input of BiCMOS driver 36. Thus, the signal at output line 50 is given by:

$$OUT = A\ B$$

Combined translator-decoder circuits 33-35 have the same circuit topology as that of translator-decoder circuit 32. However, the connections from the buffered lines to the gates of the P-channel FETs are varied for each translator-decoder circuit as shown in the schematic. In accordance with the connections shown, translator-decoder circuit 33 and driver 37 provide a TTL signal at output line 51 according to the equation:

$$OUT = A\ B.$$

Translator-decoder circuit 34 and driver 38 provide a TTL signal at output line 52 according to the equation:

$$OUT = A\ B.$$

Finally, translator-decoder circuit 35 and driver 39 provide a TTL signal at output line 53 according to the equation $$OUT = A\ B.$$

Figure 1:
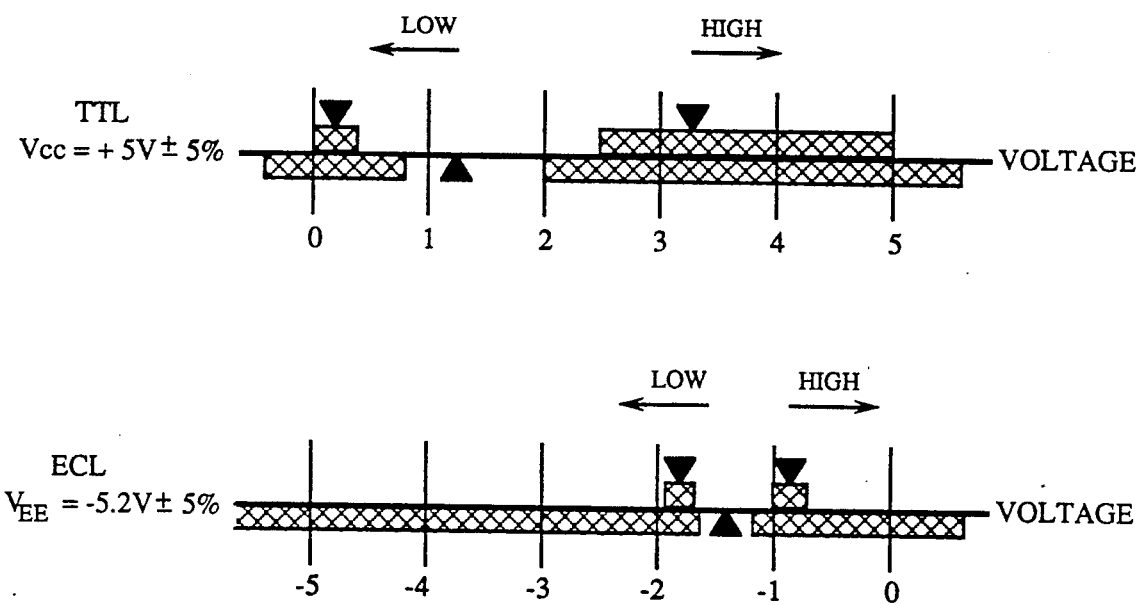
FIG. 1 shows rated and typical voltage levels for the ECL and TTL logic families.
Figure 2:
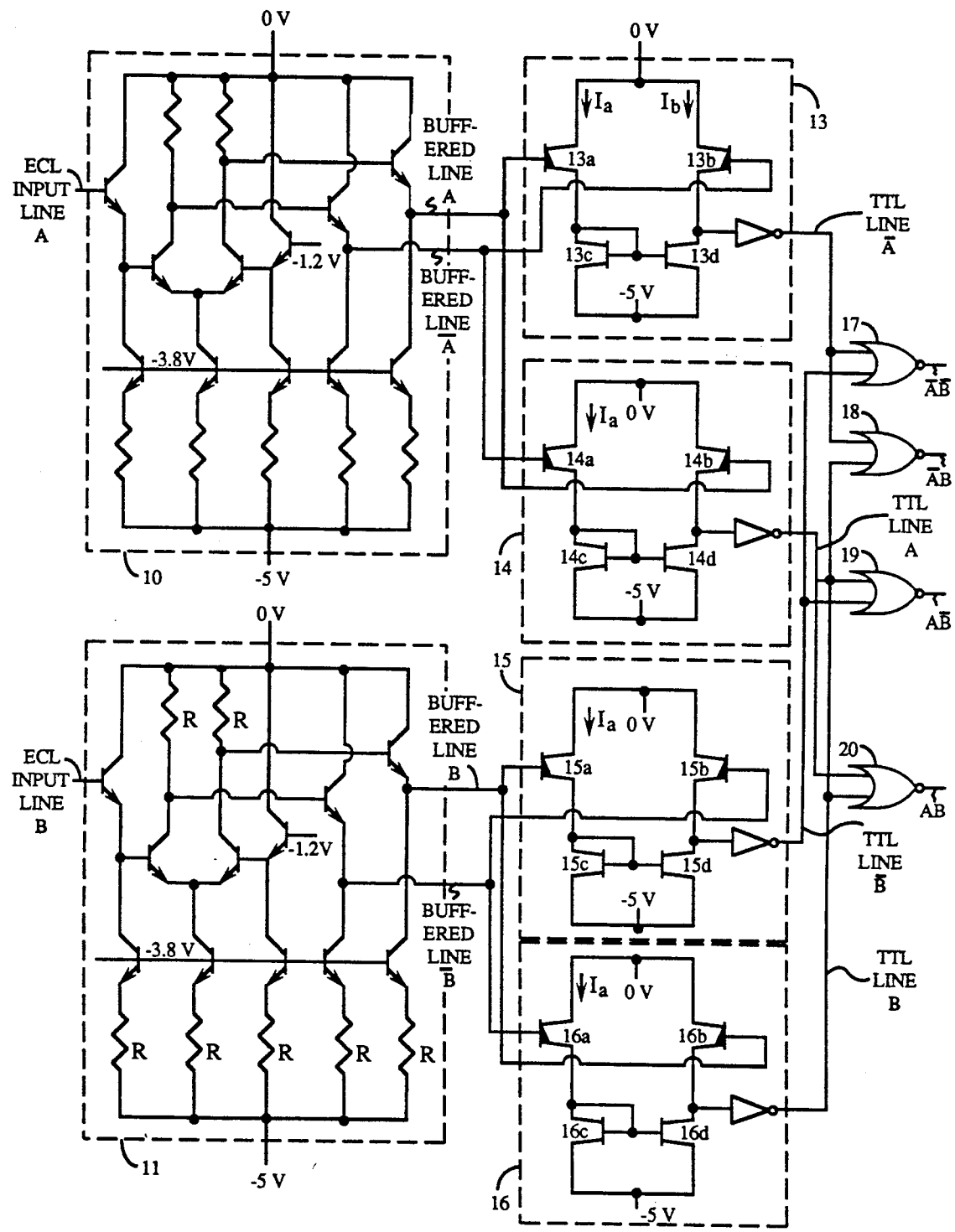
FIG. 2 (Prior Art) shows a translator and decoder circuit which accepts ECL input signals and provides TTL decoded output signals.

The circuit of FIG. 3 therefore translates and decodes ECL input signals and provides TTL output signals, as does the circuit of FIG. 2. However, the current for each translator-decoder circuit is controlled such that current $I_a$ flows appreciably in only one of the translator-decoder circuits 32-35 for a given input signal combination. For example, when the signals at ECL input lines A and B are both logic HIGH, FETs 32a and 32b are OFF and hence the current $I_a$ for translator-decoder circuit 32 is approximately zero. At the same time, FET 33a is OFF and hence the current $I_a$ for translator-decoder circuit 33 is approximately zero, and FET 34a is OFF and hence the current $I_a$ for translator-decoder circuit 34 is approximately zero. Translator-decoder circuit 35 is the only one of the translator/decoder circuits 32-35 wherein both its series FETs (35a and 35b) are biased ON to allow appreciable current $I_a$ to flow. Since current $I_a$ flows in only one of the translator/decoder circuits at a given time, less overall power is consumed in comparison to the circuit of FIG. 2.

In addition, the circuit of FIG. 3 does not require separate NOR gates to implement the decoding function. Since separate NOR gates are not required, their associated delay is eliminated and the overall speed of the circuit is faster in comparison to the speed of the circuit of FIG. 2.

The embodiment described above is intended to be exemplary and not limiting. In view of the above disclosure, modifications will be obvious to one of ordinary skill in the art without departing from the scope of the invention.

I claim:

1. A combined translator and decoder circuit for translating and decoding a plurality of ECL input signals and for providing a decoded TTL output signal comprising:

a first transistor having a control line connected to receive a signal indicative of a first of said ECL input signals;

a second transistor connected in series with said first transistor and having a control line connected to receive a signal indicative of a second of said ECL input signals;

a third transistor having a control line connected to receive a signal indicative of said first ECL input signal;

a fourth transistor connected in parallel with said third transistor and having a control line connected to receive a signal indicative of said second ECL input signal; and a current mirror circuit connected to said second transistor, to said fourth transistor, and to an output line.

2. The combined translator and decoder circuit of claim 1 further comprising:

a first ECL input buffer connected to the control line of said first transistor and to the control line of said third transistor; and a second ECL input buffer connected to the control line of said second transistor and to the control line of said fourth transistor.

3. The combined translator and decoder circuit of claim 1 wherein said first, second, third, and fourth transistors are P-channel FETs.

4. The combined translator and decoder circuit of claim 1 further comprising an inverting driver circuit connected to said third and fourth transistors.

* * * * *

UNITED STATES PATENT AND TRADEMARK OFFICE
CERTIFICATE OF CORRECTION

PATENT NO.    :  5,017,812
DATED         :  May 21, 1991
INVENTOR(S)   :  Chau-Chin Wu It is certified that error appears in the above-identified patent and that said Letters Patent is hereby corrected as shown below:

Col. 2, line 47, after "$\overline{A}$" insert --.--.

Col. 4, line 26, equation should read --OUT=$\overline{A}$ $\overline{B}$--.

Col. 4, line 36, equation should read --OUT=$\overline{A}$ B.--.

Col. 4, line 41, equation should read --OUT=A $\overline{B}$.--.

Signed and Sealed this

Ninth Day of February, 1993

Attest:

STEPHEN G. KUNIN

*Attesting Officer*      Acting Commissioner of Patents and Trademarks